(12) United States Patent
Herdey et al.

(10) Patent No.: US 7,043,206 B2
(45) Date of Patent: May 9, 2006

(54) FULLY INTEGRATED OFFSET COMPENSATION FEEDBACK CIRCUIT

(75) Inventors: Cheryl Herdey, Encinitas, CA (US); Shane Kaiser, San Diego, CA (US); Hung-Chuan Pai, San Diego, CA (US); Laurent Perraud, Saint Jeannet (FR); Nicolas Sornin, Nice (FR); Gerald J. Twomey, Escondido, CA (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 10/280,991

(22) Filed: Oct. 25, 2002

(65) Prior Publication Data

US 2003/0098734 A1    May 29, 2003

(30) Foreign Application Priority Data

Oct. 26, 2001   (EP)   ................................. 01480102

(51) Int. Cl.
*H04B 1/10* (2006.01)
*H04B 15/00* (2006.01)

(52) U.S. Cl. .................. 455/63.1; 455/296; 375/350; 327/337; 327/362; 327/363

(58) Field of Classification Search ............ 455/63.1, 455/278.1, 284, 296, 305, 260, 283, 307; 327/54, 307, 337, 341, 345, 554, 558, 362–363; 375/319, 348, 233, 350
See application file for complete search history.

(56) References Cited

U.S. PATENT DOCUMENTS

| | | | | |
|---|---|---|---|---|
| 5,471,665 A | * | 11/1995 | Pace et al. | 455/343.2 |
| 5,500,894 A | * | 3/1996 | Hershbarger | 379/399.02 |
| 5,648,738 A | * | 7/1997 | Welland et al. | 327/307 |
| 6,005,431 A | * | 12/1999 | Mehr et al. | 327/307 |
| 6,313,685 B1 | * | 11/2001 | Rabii | 327/307 |
| 6,351,506 B1 | * | 2/2002 | Lewicki | 375/350 |
| 6,400,214 B1 | * | 6/2002 | Aram et al. | 327/541 |
| 6,420,917 B1 | * | 7/2002 | Klemmer | 327/156 |
| 6,424,208 B1 | * | 7/2002 | Pinai | 327/554 |
| 6,426,663 B1 | * | 7/2002 | Manlove et al. | 327/307 |
| 6,476,593 B1 | * | 11/2002 | Schmal et al. | 324/76.24 |
| 6,535,561 B1 | * | 3/2003 | Boesch et al. | 375/296 |
| 6,577,183 B1 | * | 6/2003 | Nakamura et al. | 330/9 |
| 6,606,359 B1 | * | 8/2003 | Nag et al. | 375/348 |

* cited by examiner

Primary Examiner—Simon Nguyen
(74) Attorney, Agent, or Firm—Ira D. Blecker

(57) ABSTRACT

An offset correction analogic circuit capable of compensating the offset of a digital baseband is described. The circuit comprises analog means to receive an output differential signal issued from a differential signal path. The differential signal path may be a baseband filter as used in digital communication systems. The baseband filter inputs an input differential signal having an offset to be compensated. The output differential signal is fed into an analog integrator to generate a pulsed signal either on a first output line or on a second output line according to the polarity of the output differential signal. The pulsed signal is then integrated into a switched capacitor and a differential compensation offset signal is issued. The frequency of the pulsed signal is preferably proportional to the voltage value of the output differential signal. The compensation offset signal may be summed with the input differential signal into a summing circuit.

9 Claims, 4 Drawing Sheets

FULLY INTEGRATED OFFSET COMPENSATION FEEDBACK CIRCUIT

TECHNICAL FIELD

The present invention relates to offset compensation circuits, and more particularly to such circuits for baseband filters.

BACKGROUND ART

Cellular telephones, as with most communication systems, require high gain baseband filters within the receive signal path. In such applications, the in-band signal is amplified and conveyed to subsequent stages for processing, e.g., to an analog-to-digital converter (ADC). This analog filtering serves two purposes: reducing the magnitude of interfering signals outside the band of interest; and providing anti-aliasing.

The DC offsets in the receive signal path cause performance of the system to degrade in at least two ways. Offsets near the front end of the system get amplified by the active filter circuit and thereby reduce the available dynamic range of the ADC at the output. Additionally, offsets create errors in the two receiver signal paths commonly referred to as "in-phase" (I) and "quadrature" (Q) signal paths, thereby creating constellation distortion. Offset within the quadrature signal paths has been removed in conventional systems by using a low frequency feedback loop to cancel such offset component. In a conventional CDMA spread spectrum cellular telephone system, for example, the baseband information bandwidth extends from one to 1884 kilohertz (kHz). So as to not attenuate the low frequency baseband information, the offset cancellation loop bandwidth must be kept well below 1 kHz. So as to maintain signal integrity, low frequency phase response and group delay matching between the I and Q channels is just as important as magnitude matching. The offset cancellation loop bandwidth is typically set to approximately 100 hertz (Hz) to satisfy such requirements.

The offset compensation generally may be solved by two conventional approaches. In the first one, the offset is detected by a digital baseband processor, and a feedback signal is provided by way of a pulse density modulated (PDM) output signal generated by a modulator/demodulator (MODEM) chip. This digital signal is filtered by a first order resistive-capacitive (RC) network. The output of this filter is next fed into an analog receive filter. The drawback of such solution is that it requires external components (the RC network) for filtering the output of the PDM. Moreover, some of the baseband digital processors do not include the offset compensation feature.

The second prior art solution is based on a fully analogic feedback compensation system wherein the feedback signal is generated by way of analog integrator. As an example, U.S. Pat. No. 5,471,665 from Pace and al. discloses a differential direct current (DC) offset compensation circuit for providing DC offset compensation to a circuit device. The DC offset compensation circuit comprises a differential integrator and a summing network. The circuit device is one of several types of devices, such as a DC coupled amplifier. The differential input of the circuit device is suitable for coupling to a differential input source and the differential output of the circuit device is suitable for connection to a load. The differential integrator features a transconductance amplifier at least one other amplifier, and a capacitor element having a capacitance of C1. The summing network sums the differential integrator output with the differential input signals of the differential input source and cancels DC offsets of the differential input source and the circuit device. Such solution either implemented using a transconductance amplifier associated to capacitors or implemented using a charge pump results in excessive area and not being integrable on-chip due to the high capacitance (of the order of several nanofarad) required to obtain the low bandwidth needed.

Therefore there is a need for a fully analogic integrable offset compensation system.

SUMMARY OF THE INVENTION

Accordingly, it is an object of the present invention to provide an offset correction analogic circuit capable of compensating the offset of a digital baseband.

This object is achieved by employing a circuit which comprises analog means to receive an output differential signal issued from a differential signal path. The differential signal path may be a baseband filter as used in digital communication systems. The baseband filter inputs an input differential signal having an offset to be compensated. The output differential signal is fed into an analog integrator to generate a pulsed signal either on a first output line or on a second output line according to the polarity of the output differential signal. The pulsed signal is then integrated into a switched capacitor and a differential compensation offset signal is issued. The frequency of the pulsed signal is preferably proportional to the voltage value of the output differential signal. The compensation offset signal may be summed with the input differential signal into a summing circuit.

DETAILED DESCRIPTION OF THE INVENTION

Figure 1:
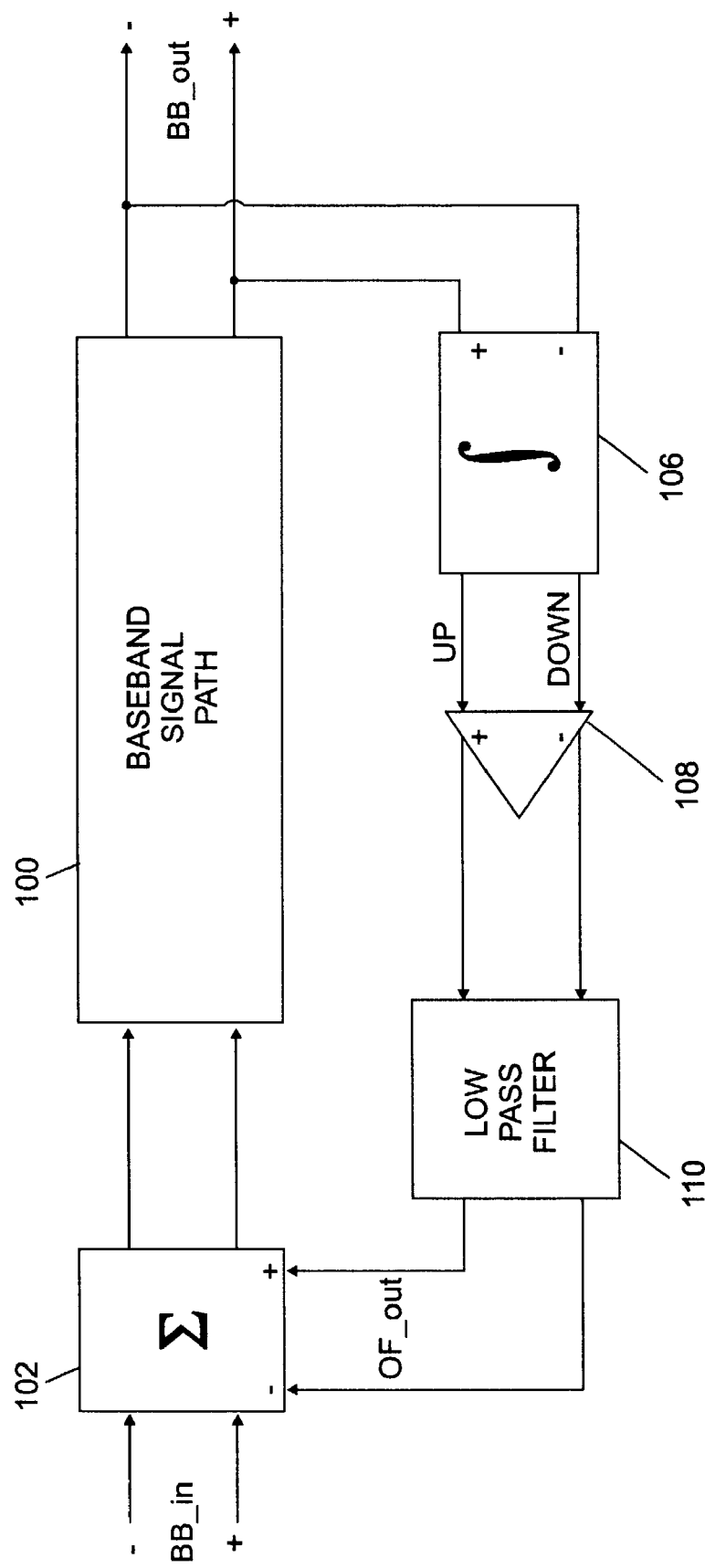
FIG. 1 shows a general block diagram of the present invention.

Referring now to the drawings, and more particularly to FIG. 1, a block diagram of the present invention is described. Generally speaking, the invention is preferably used in conjunction with a baseband signal path 100 that filters and gains an input differential signal 'BB_in' having an offset to be compensated. The output of the baseband filter 100 is a differential baseband output signal 'BB_out' to be used by an output load such as for example an A/D converter. A summing device 102 is connected in front of the baseband filter 100 allowing to sum an offset feedback output signal 'OF_out' generated by the system of the invention to the differential baseband input signal 'BB_in' in order to compensate the offset.

The offset compensation system is a feedback loop connected between the output of the baseband filter 100 and the input of the summing device 102. The feedback loop is made of a frequency modulated pulse generator 106 connected to a switched capacitor integrator 108. The frequency modulated pulse generator senses the differential baseband output signal 'BB_out' to output a frequency modulated pulsed digital signal either on an 'up-line' or on a 'down-line' according to the polarity of the baseband output signal 'BB_out'. The outputs of the pulse generator 106 are connected to respective inputs of the switched capacitor integrator 108 which output is connected to the summing device 102 either directly or through a low pass filter circuit 110.

The specific details of operation of the summing device 102 and of the gain and filter circuit 100, which are well understood by those skilled in the art, will be omitted from this discussions. However, it is to be noted that if the baseband filter is an active RC filter the summing device may only consist of two resistors. Those alternatives have no impact on the invention.

In operation, according to the polarity of the differential baseband output signal 'BB_out', the pulsed signal is generated by the pulse generator either on the up-line or on the down-line. The frequency of the pulses is proportional to the absolute value of the output baseband filter voltage 'BB_out'. The pulses are next integrated by the integrator device 108 to generate the differential compensation offset signal 'OF_out'. Each pulse generated on the up-line, respectively on the down-line, generates a positive step, respectively a negative step, at the output of the switched capacitor integrator 108. Finally, the compensation offset signal 'OF_out' is summed to the baseband input signal 'BB_in' through circuit 102 in a well known manner to close the feedback loop, and the signal fed to the baseband filter is offset compensated.

In an alternate embodiment, the output of the switched capacitor integrator 108 is fed into a low passed filter 110 to generate a smoothed 'OF_out' signal. The low pass filter may be implemented in the form of a common RC circuit.

Figure 2:
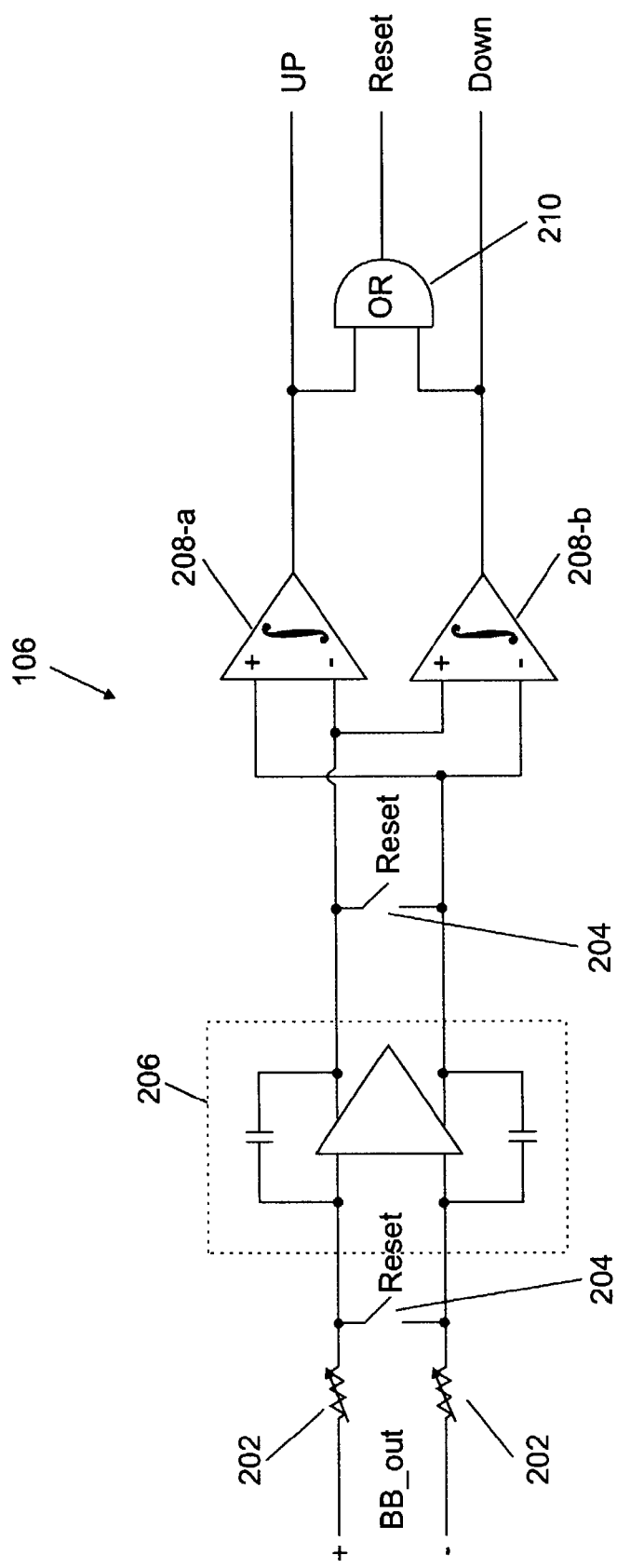
FIG. 2 is a preferred implementation of a frequency modulated pulse generator used in the circuit of FIG. 1.

Referring now to FIG. 2, a preferred embodiment of the frequency modulated pulse generator 106 is detailed. The generator is composed of a continuous time integrator connected in series with a pair of differential hysteresis comparators 208-a, 208-b. The time integrator is made of a pair of variable resistors 202, each being connected in series on each differential baseband output line. Each second node of the series resistors is respectively connected to the input of a differential amplifier 206. The differential output of this latter is input to a pair of differential hysteresis comparators 208-a, 208-b. Those skilled in the art will readily understand that the input polarity of comparator 208-a is inverted to the input polarity of comparator 208-b to operate in opposite phase. The output of each comparator is the respective up-line and down-line generating the 'up' and 'down' signals to be inputted to the switched capacitor integrator 108.

A reset signal 'Reset' is generated by performing a logic OR function 210 between the up and down lines. This reset signal triggers two switches 204 respectively placed at the input and the output of the continuous time integrator to allow reset of this latter.

Figure 3:
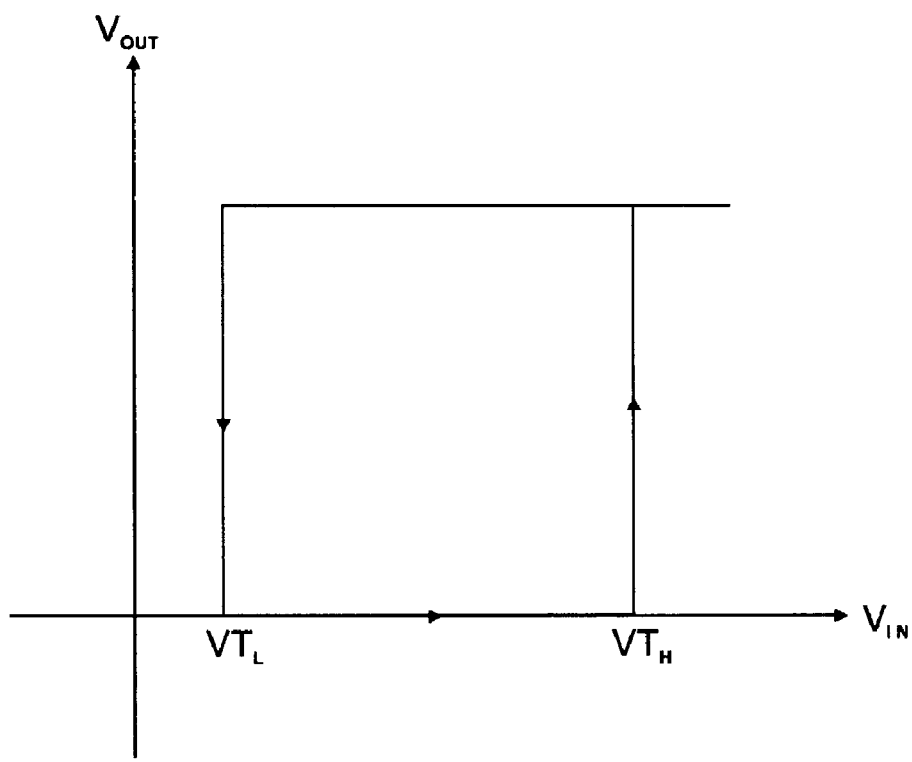
FIG. 3 illustrates an hysteresis curve of the hysteresis comparators used in the circuit of FIG. 2.

Going now to FIG. 3, the principle of the hysteresis comparators 208-a and 208-b are now explained. FIG. 3 shows the hysteresis response of the comparators as used by the present invention. On the horizontal axis, the input voltage is represented while the output voltage is shown on the vertical axis. The two hysteresis high and low thresholds are referenced as Vth and Vtl, and is to be noted that a feature of the present invention is to fix both thresholds to a positive value in order to avoid that the circuit stays in a reset state indefinitely, as it will be the case for a negative value of the low threshold. The value of Vth depends on the saturation level of the continuous time integrator. The value of Vtl may be chosen in the range of 0 to Vth. However, the closer Vtl and Vth will be, the larger the bandwidth of the loop.

It is to be appreciated that a major advantage of the invention is to adapt easily the bandwidth of the feedback loop. In fact, those skilled in the art will easily understand that the mean period 'T' between two pulses is equal to:

$$T = \frac{(Vth - Vtl)RC}{\text{BB\_out}}, \quad (1)$$

wherein R is the value of the variable resistor and C the capacitance of the differential amplifier 206.

From equation (1) it appears that the frequency of the pulses is proportional to the 'BB_out' signal voltage, and could be modified by simply adjusting the value of the two variable resistors 202.

It is to be noted that the above described preferred embodiment is not to limit the invention and that any other implementation could be adapted, such as for example a generation of the up and down signals directly made by a digital baseband processor.

Moreover, the present invention is not limited to a particular technology process, and may be implemented using for example the MOSFET technology.

Figure 4:
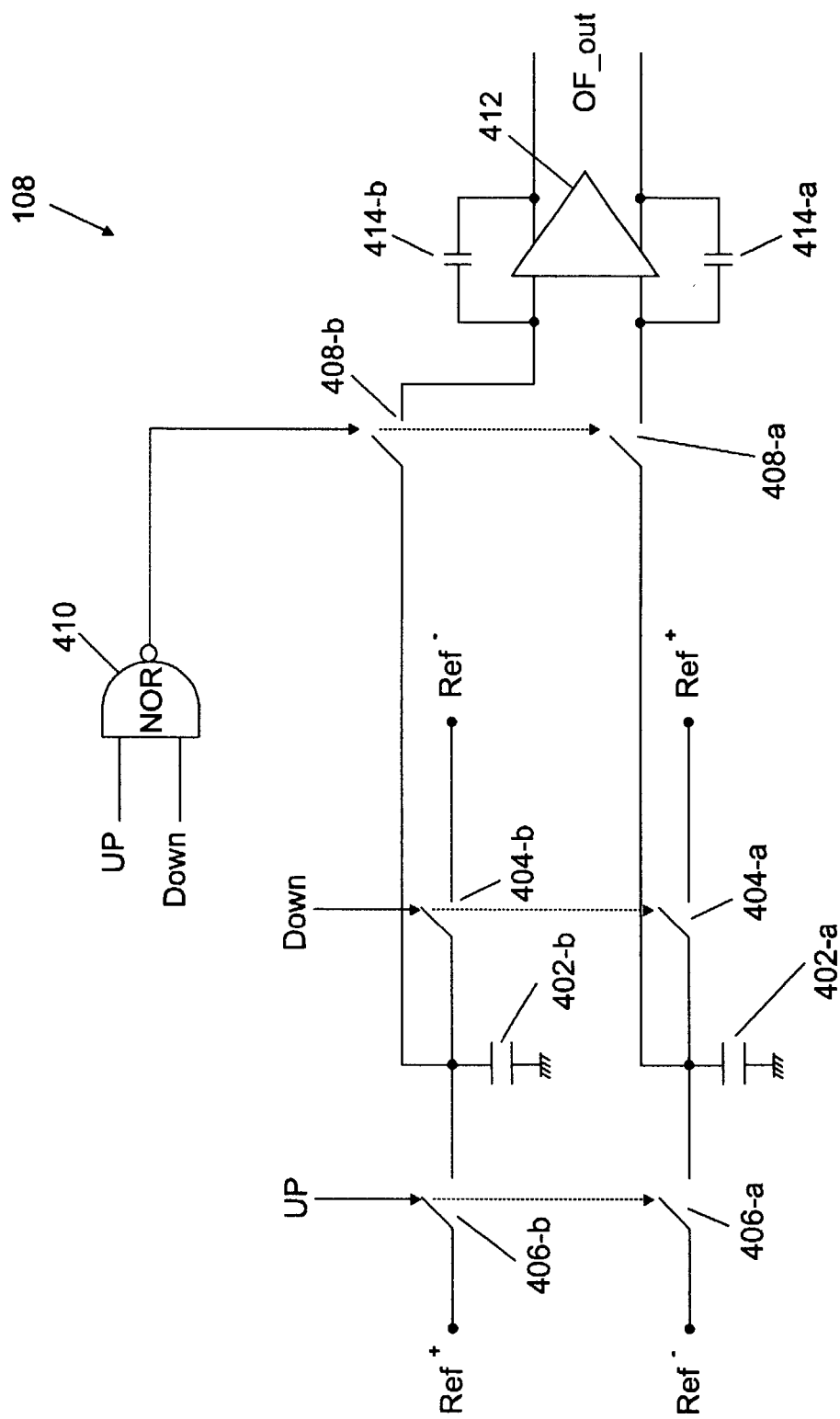
FIG. 4 is a preferred implementation of a switched capacitor used in the circuit of FIG. 1.

Going now to FIG. 4, a preferred embodiment of the switched capacitor integrator 108 is now described. A first capacitor 402-a having one input connected to ground can either sample a first reference voltage Ref+ through a first switch 404-a or a second reference voltage Ref− through a second switch 406-a, by a corresponding connection of a second input. The opposite voltage references Ref+ and Ref− can be generated by conventional means such as a D/A Converter, or by any device generating a controllable differential voltage.

Respectively, a second capacitor 402-b having one input connected to ground can either sample the second reference voltage Ref− through a third switch 404-b or the first reference voltage Ref+ through a fourth switch 406-b, by a corresponding connection of a second input. First and third switches 404-a and 404-b are controlled by the 'down' signal from the down-line, while second and fourth switches 406-a and 406-b are controlled by the 'up' signal from the up-line. The two capacitors 402-a and 402-b are furthermore respectively connected to a pair of fifth and sixth switches 408-a and 408-b to allow the transfer of the respective capacitors' charges to integration capacitors 414-a and 414-b thanks to a differential amplifier 412. The two switches 408-a and 408-b are triggered by a logic NOR device 410 obtained between the NOR function of the up and down signals. In operation, those skilled in the art will understand that when a pulse is sent on the up line, the differential voltage at the output of the integrator is modified according to equation (2):

$$(Ref+ - Ref-) \times \frac{C_i}{C_s}, \quad (2)$$

where Ci is the value of the integration capacitance (414-a, 414-b) and Cs is value of the sampling capacitance (402-a, 402-b). Respectively when a pulse is sent on the down line, the differential voltage at the output of the integrator is modified according to equation (3):

$$-(Ref+ - Ref-) \times \frac{C_i}{C_s}. \tag{3}$$

It is to be recall that the output of the differential amplifier 412 is the differential compensation offset signal signal 'OF_out' of the offset compensation loop.

In an alternate embodiment, the 'OF_out' signal may be freezed after a preliminary offset compensation operation by simply turning off the frequency modulated pulse generator.

The skilled person will appreciate that the present configuration allows to easily modify the voltage variation at the output of the integrator 106 associated with each pulse, simply by controlling the voltage difference between the positive reference Ref+ and the negative reference Ref–.

It is also to be noted that the noise at the output of the integrator 106 can be made compatible with the noise level required by the commonly used today standards such as the CDMA or the GSM ones at the input of their analog baseband.

Finally, the advantages of the present invention are mainly that the switching frequency is proportional to the output signal thereby having the characteristics of a pseudo-random signal, contrary to common switched capacitors which generate undesirable noise.

Moreover, it has been experimented in W-CDMA application that the total capacitance used by this solution has led to a total capacitor value of 20 picofarad.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. An offset compensation apparatus comprising:
   analog means for receiving an output differential signal issued from a differential signal path that inputs an input differential signal having an offset to be compensated and for generating a first pulsed signal 'Up' on a first output line or a second pulsed signal 'Down' on a second output line according to the polarity of the output differential signal, wherein said analog means for generating the pulsed signal further comprising a continuous time integrator connected in series with a pair of differential hysteresis comparators, said comparators having positive low and high threshold values and operating in opposite phase; and
   switched capacitor means for providing a differential compensation offset signal 'OF$_{13}$out' upon reception of said first or second pulsed signal;
   wherein the frequency of said first or second pulsed signal is in a relationship with the output differential signal.

2. The apparatus of claim 1 wherein the differential signal path comprises a baseband filter and further comprising summing means coupled to the input of said baseband filter for summing the compensation offset signal with the input differential signal.

3. The apparatus of claim 2 wherein said summing means comprises resistive means.

4. The apparatus of claim 1 wherein the continuous time integrator comprises a pair of variable resistors, each resistor being connected in series between one output of the differential signal path and one input of a differential amplifier.

5. The apparatus of claim 4 further comprising means for reselling said differential amplifier.

6. The apparatus of claim 1 wherein the frequency of said first or second pulsed signal is proportional to the absolute value of the output differential signal.

7. The apparatus of claim 1 wherein the switched capacitor means further comprises means for adjusting the value of said first or second pulsed signal.

8. A portable communication device comprising the apparatus of claim 1.

9. An offset compensation apparatus comprising:
   analog means for receiving an output differential signal issued from a differential signal path that inputs an input differential signal having an offset to be compensated and for generating a first pulsed signal 'Up' on a first output line or a second pulsed signal 'Down' on a second output line according to the polarity of the output differential signal, wherein said analog means for generating the pulsed signal further comprising a continuous time integrator connected in series with a pair of differential hysteresis comparators, said comparators having positive low and high threshold values and operating in opposite phase; switched capacitor means for providing a differential compensation offset signal 'OF$_{13}$ out' upon reception of said first or second pulsed signal; and
   a low pass filter coupled to the output of said switched capacitor means;
   wherein the frequency of said first or second pulsed signal is in a relationship with the output differential signal.

* * * * *